Feb. 6, 1968 N. H. DITRICK 3,368,124

SEMICONDUCTOR DEVICES

Filed Dec. 9, 1965

INVENTOR.
NORMAN H. DITRICK
BY
Glenn H. Bruestle
ATTORNEY

United States Patent Office 3,368,124

Patented Feb. 6, 1968

3,368,124

SEMICONDUCTOR DEVICES

Norman H. Ditrick, Somerville, N.J., assignor to Radio Corporation of America, a corporation of Delaware Filed Dec. 9, 1965, Ser. No. 512,656
10 Claims. (Cl. 317—235)

This invention relates to improved semiconductor devices, and particularly to improved metallic contacts thereon.

In the manufacture of semiconductor devices, electrical connections are usually made thereto. Since it is difficult to bond a metallic electrical lead wire directly to a semiconductive body, it has been the usual practice to deposit a metallic mass or layer on at least a portion of the body, alloy the metallic mass to the body, and then bond the electrical lead wire to the metallic mass.

Although satisfactory bipolar devices have been fabricated in this manner, certain problems are encountered in the fabrication of some types of field-effect devices, wherein it is necessary to provide a control electrode on an insulating layer as well as other electrodes on the semiconductive body itself. Usually, field-effect devices have been fabricated by using two different and successive processes to form the metallic contacts, because those methods which formed a good metallic contact to the semiconductive body itself did not work well on the insulating layer, while those methods used to fabricate a good metallic contact on the insulating layer were not satisfactory when applied to the semiconductor. Although adherent electrodes have been fabricated in this manner, the control electrodes have not been as stable as desirable, so that the devices tend to break down when subjected to a sudden electrical stress.

Accordingly, it is an object of this invention to provide improved electrical connections to semiconductive devices.

Another object is to provide improved metallic electrodes on semiconductive bodies.

Another object is to provide improved metallic electrodes on insulating layers deposited on semiconductive bodies.

These objects are accomplished by first depositing a film of chromium on the surface of a semiconductor body and/or on an insulating layer on the semiconductor body. A coating of aluminum is then deposited on the chromium film. The electrode thus formed consists of two distinct layers, and has been found particularly advantageous as an ohmic contact for certain field-effect devices. It has unexpectedly been found that insulated-gate field-effect devices fabricated in this manner can pass a small amount of gate current without destroying the device.

Figure 1:
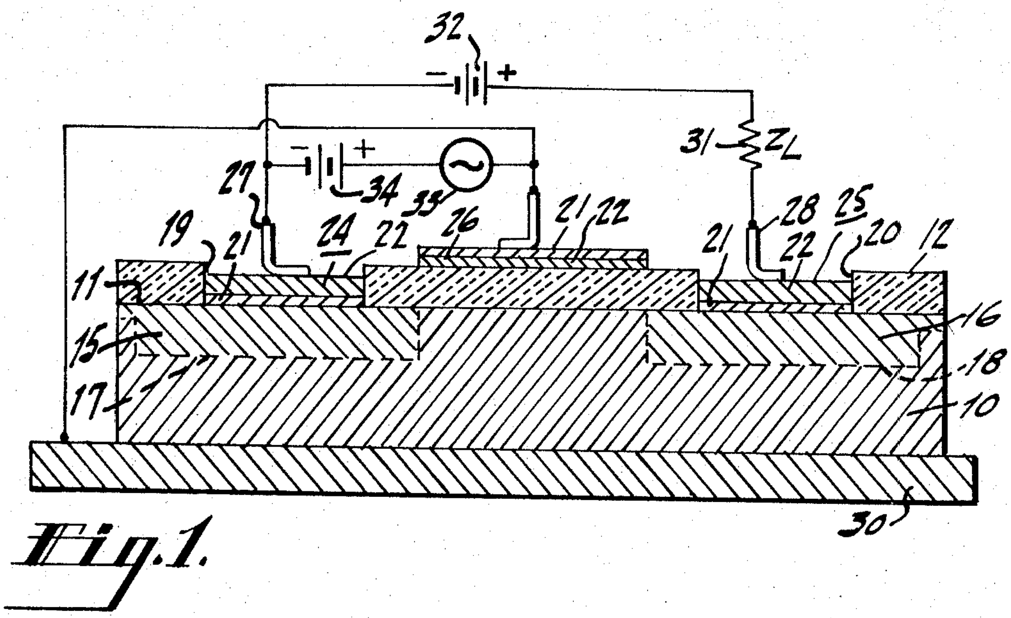
Figure 2:
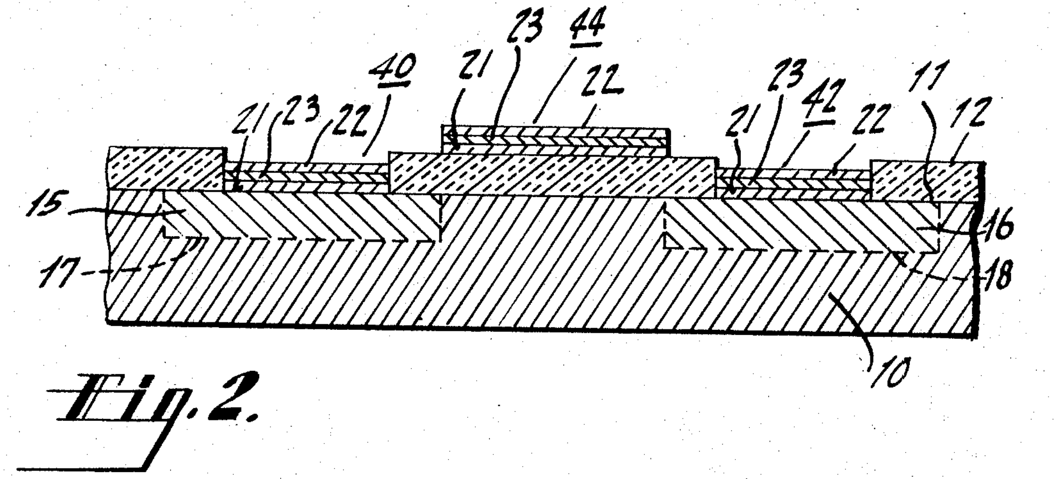

FIGURE 1 is a cross-sectional view of a completed field-effect semiconductor device incorporating one embodiment of the improved electrode, together with a circuit indicating the customary operation of the device; and, FIGURE 2 is a cross-sectional view of a portion of a semiconductive body during one step in the fabrication of a field-effect semiconductor device incorporating another embodiment of the improved electrode.

*Example I*

The device of FIGURE 1 comprises a field-effect semiconductor device of the type termed MOS transistor. The device includes a monocrystalline semiconductor body 10 having a planar surface 11. Two spaced low-resistivity regions 15 and 16 of conductivity type opposite that of the body are formed by diffusion of a conductivity modifier into selected portions of the planar surface 11.

Two PN junctions 17 and 18 are thereby provided respectively between each of the regions 15 and 16 and the remainder of the body 10. An insulating coating or layer 12 of silicon oxide is deposited on the surface 11 and is provided with a pair of spaced openings 19 and 20. One opening 19 is completely within one diffused region 15, and the other opening 20 is completely within the other diffused region 16.

A chromium film 21 is now deposited by any convenient method, for example by vacuum evaporation, over the exposed portions of surface 11, and over the remaining portions of the insulating layer 12. Suitably, the chromium film 21 is about 50 to 2500 Angstroms thick.

An aluminum coating 22 is then deposited over the entire chromium film 21 by any convenient method. Suitably, the aluminum coating 22 is deposited by vacuum evaporation, and is about 500 to 10,000 Angstroms thick. Preferably the aluminum coating 22 is made severalfold thicker than the chromium film 21.

Portions of the aluminum coating 22 are covered with a resist (not shown), which may for example be paraffin wax. Alternatively, commercially available photoresists may be employed to mask the desired portions of the aluminum coating 22. The unmasked portions of the aluminum coating 22 are then removed by means of an etchant. Electrolytic etching may be utilized. In this example, the semiconductive body 10 is made the anode, and a platinum rod is made the cathode, in an electrolytic bath consisting of an aqueous 10 weight percent potassium hydroxide solution. A DC potential of about 4 to 6 volts is applied for about 10 to 20 seconds. The unmasked portions of the aluminum coating 22 are thus removed.

While the above step removes the aluminum coating 22, it does not remove the chromium film 21. The semiconductive body 10 is washed in deionized water, and briefly immersed in a hot alkaline ferricyanide solution. The solution may for example consist of about 100 grams potassium ferricyanide and 50 grams potassium hydroxide per liter, and is kept at about 50° C. An immersion time of a few seconds is sufficient to remove the unmasked portion of the chromium film 21, leaving the semiconductive body 10 with a first electrode 24 in contact with region 15, a second electrode 25 in contact with region 16, and a third electrode 26 on the insulating layer 12 over the space or separation between regions 15 and 16. Each of electrodes 24, 25 and 26 consists of two layers, a chromium layer or film 21 in direct contact with either the semiconductive body 10 or the insulating layer 12, and an aluminum layer or coating 22 on the chromium layer 21.

Electrical lead wires 27, 28 and 29 are then connected to the aluminum coating 22 of electrodes 24, 25 and 26 respectively by any convenient method, such as by thermocompression bonding, or by ultrasonic welding. The body 10 is then mounted on a metallic header 30 with its major face 11 up, i.e., opposite the header. The remaining steps of encapsulating and sealing the unit are accomplished by standard methods of the art.

The device of this example is an insulated-gate field-effect transistor which may be operated as follows. Leads 27 and 28 are the source and drain leads respectively, while lead 29 is the control or gate lead. The load impedance $Z_L$, shown as a resistance 31, together with a source of direct current potential, such as a battery 32, are connected in series between the source lead 27 and the drain lead 28, so that the source region 15 is biased negative relative to the drain region 16. The header 30 is electrically connected to the gate lead 29. A source 33 of signal potential, and a second source of direct current potential, such as a battery 34, are connected in series between control lead 29 and the source lead 27 so that the source lead 27 is biased negative relative to the gate lead 29.

Insulated-gate field-effect devices have a high input impedance, and are frequently very sensitive to static discharges. In some cases, units of this type have been damaged by merely plugging them into a test set, or by a spark of static electricity. The high input impedance of these units resists the flow of current through the device. A high voltage pulse passes through the device and breaks down the gate or control electrode.

It has unexpectedly been found that when insulated-gate field-effect transistors are fabricated as above described, with a duplex chromium-aluminum gate electrode, they are considerably more resistant to static electricity discharges and to high voltage pulses. Transistors having such electrodes have consistently been capable of passing a few microamperes of gate current without destruction. The improved resistance to static electricity discharges is obtained in both enhancement type devices and depletion type devices. For a discussion of these devices, see S. R. Hofstein and F. P. Heiman, "The Silicon Insulated-Gate Field-Effect Transistor," Proc. IEEE, volume 51, p. 1190, September 1963.

Another advantage of this embodiment of improved electrodes is that good metallic contacts are simultaneously made directly on the semiconductive body and also on an insulating layer over a portion of the surface of the semiconductive body. It has been found that evaporated chromium makes a good adherent contact to an insulator such as silicon oxide. Other metals used as contact materials, for example evaporated silver, tend to peel off the silicon oxide if deposited directly thereon.

It will be understood that the improved electrode may also be utilized when it is desired to fabricate only metallic contacts directly on the semcionductor wafer, or when it is desired to fabricate metallic contacts only on an insulating layer on a semiconductor wafer.

Although the device of this example is an insulated-gate field-effect triode, it will be understood that this is by way of example only, and not limitation, since the method is equally applicable to the fabrication of other types of triodes, and to the fabrication of junction devices generally, including diodes and tetrodes.

*Example II*

In the embodiment described in Example I above, there is a discontinuity between the chromium film 21 and the aluminum layer 22. For some purposes, it may be desirable to avoid an abrupt change in the composition of the metallic contact, in order to make the contact more stable, and to minimize any possibility of peeling the aluminum coating from the chromium film. This is accomplished in the second embodiment as next described.

In this example a semiconductor body 10 having a planar surface 11 is processed as described with reference to FIGURE 1 to a point just prior to the deposition of the chromium layer 21.

Referring now to FIGURE 2, the body 10 is positioned in a bell jar (not shown) which is maintained at a residual atmospheric pressure of not more than $1\times10^{-4}$ mm. Hg, and preferably at $1\times10^{-6}$ mm. Hg. The bell jar contains two evaporators (not shown), such as tungsten wire spirals, the first evaporator containing a mass of chromium, and the second evaporator containing a mass of aluminum. Current is supplied to the first evaporator only to deposit a chromium film 21 on the surface 11. Suitably the chromium film 21 is about 50 to 2500 Angstroms thick. Next, current is supplied to both evaporators simultaneously to deposit a mixed layer 23 consisting of chromium and aluminum. The mixed chromium-aluminum layer thus deposited is preferably about 100 to 1000 Angstroms thick. Then the current is supplied to the second evaporator only, so as to deposit a coating 22 of pure aluminum on the chromium-aluminum layer 23. The pure aluminum coating 22 is preferably about 500 to 10,000 Angstroms thick.

The subsequent steps of masking the wafer and the metallic layers thereon by means of a suitable resist, and removing the undesired portions of the metallic layers to form separate metallic electrodes 40, 42 and 44 are performed as described above in connection with Example I. In this example, each of the metallic contacts or electrodes 40, 42 and 44 has a triplex structure consisting of a chromium film 21 in direct contact with either the semiconductive body 10 or the insulating layer 12, a chromium-aluminum layer 23 on the chromium film 21, and an aluminum coating 22 on the chromium-aluminum layer 23. To complete the device, electrical lead wires are attached to the metallic contacts, and the devices are mounted and cased as described above in connection with FIGURE 1.

An advantage of this embodiment is that the composition of the metallic contact changes somewhat gradually from pure chromium to mixed chromium and aluminum to pure aluminum. Accordingly, there is no abrupt change in the composition of the contact, and hence any tendency for the layers to separate or peel is minimized.

It will be understood that the above examples are by way of explanation only, and not limitation, since various modifications may be made without departing from the spirit and scope of the invention as set forth in the specification and the appended claims. The fabrication of only one type of semiconductor device has been described for greater clarity, but it will be understood that metallic contacts may also be fabricated on other types of semiconductor devices, including diodes and tetrodes, in the same manner. Other etchants may be utilized. If desired, the chromium layer can be deposited over the surface of the semiconductive body, and the undesired portions thereof removed by etching prior to the deposition of aluminum over the chromium.

What is claimed is:

1. A semiconductor device comprising a crystalline semiconductive body, a chromium film on a portion of a surface of said body, an aluminum coating on said chromium film, and an electrical lead wire attached to said aluminum coating.

2. The semiconductor device as in claim 1, wherein said chromium film is about 50 to 2500 Angstroms thick, and said aluminum coating is about 500 to 10,000 Angstroms thick.

3. The semiconductor device as in claim 1, wherein said semiconductive wafer consists of silicon.

4. The semiconductor device of claim 1 which includes an insulating layer interposed between and in contact with said surface and said chromium film.

5. A semiconductor device comprising a monocrystalline silicon body having an insulating layer on a portion of a surface thereof, at least one electrode on said insulating layer, at least one electrode on said surface, and electrical lead wires attached to each of said electrodes, at least one of said electrodes having a duplex structure consisting of a chromium film covered by an aluminum coating.

6. The semiconductor device as in claim 5, wherein said insulating layer consists of silicon oxide.

7. The semiconductor device as in claim 5, wherein said chromium film is about 50 to 2500 Angstroms thick, and said aluminum coating is about 500 to 10,000 Angstroms thick.

8. The semiconductor device as in claim 5, wherein at least one of said electrodes has a triplex structure consisting of a chromium film, a chromium-aluminum layer on said film, and an aluminum coating on said chromium-aluminum layer.

9. The semiconductor device as in claim 1, wherein at least one of said electrodes has a triplex structure consisting of a chromium film, a chromium-aluminum layer on said film, and an aluminum coating on said chromium-aluminum layer.

10. The semiconductor device as in claim 4, wherein at least one of said electrodes has a triplex structure consisting of a chromium film, a chromium-aluminum layer on said film, and an aluminum coating on said chromium-aluminum layer.

References Cited

UNITED STATES PATENTS

| | | | |
|---|---|---|---|
| 2,973,466 | 2/1961 | Atalla et al. | 317—240 |
| 3,177,100 | 4/1965 | Mayer et al. | 148—175 |

| | | | |
|---|---|---|---|
| 3,231,421 | 1/1966 | Schmidt | 117—2.2 |
| 3,241,931 | 3/1966 | Triggs et al. | 29—195 |
| 3,266,127 | 8/1966 | Harding et al. | 29—155.5 |
| 3,290,565 | 12/1966 | Hastings | 317—234 |
| 3,290,570 | 12/1966 | Cunningham et al. | 317—240 |

JOHN W. HUCKERT, *Primary Examiner.*

J. SHEWMAKER, *Assistant Examiner.*